(12) United States Patent
Zhang et al.

(10) Patent No.: US 6,787,238 B2
(45) Date of Patent: Sep. 7, 2004

(54) TERPOLYMER SYSTEMS FOR ELECTROMECHANICAL AND DIELECTRIC APPLICATIONS

(75) Inventors: Qiming Zhang, State College, PA (US); Zhongyang Cheng, State College, PA (US); Haisheng Xu, Linköping (SE)

(73) Assignee: The Penn State Research Foundation, University Park, PA (US)

( * ) Notice: Subject to any disclaimer, the term of this patent is extended or adjusted under 35 U.S.C. 154(b) by 123 days.

(21) Appl. No.: 10/108,231

(22) Filed: Mar. 27, 2002

(65) Prior Publication Data

US 2002/0146567 A1 Oct. 10, 2002

Related U.S. Application Data

(63) Continuation-in-part of application No. 09/195,061, filed on Nov. 18, 1998, now Pat. No. 6,423,412.
(60) Provisional application No. 60/280,303, filed on Mar. 30, 2001.

(51) Int. Cl.$^7$ .......................... B32B 27/30; C08F 14/22; C08F 14/24; C08F 14/26; C08F 16/24
(52) U.S. Cl. ................. 428/421; 428/910; 526/247; 526/249; 526/250; 526/254; 526/255
(58) Field of Search ............................ 526/250, 247, 526/249, 254, 255; 428/421, 910

(56) References Cited

U.S. PATENT DOCUMENTS

| | | | |
|---|---|---|---|
| 4,298,719 A | 11/1981 | Mizuno et al. ............. 526/255 |
| 4,577,005 A * | 3/1986 | Sako et al. ................. 526/254 |
| 4,824,911 A | 4/1989 | Chu ........................... 525/199 |
| 5,087,679 A * | 2/1992 | Inukai et al. ............... 526/249 |
| 5,356,500 A | 10/1994 | Scheinbeim et al. ........ 156/229 |
| 6,215,231 B1 | 4/2001 | Newnham et al. .......... 310/371 |
| 6,291,106 B1 | 9/2001 | Daido et al. ................ 429/306 |
| 6,423,412 B1 * | 7/2002 | Zhang et al. ............... 428/421 |

OTHER PUBLICATIONS

Park et al. "Ultrahigh strain and piezoelectric behavior in relaxor based ferroelectric single crystals." J. Appl. Phys. 82 (4), Aug. 15, 1997.
Ferroelectrics, 1990, vol. 109, pp. 303–308, F. Macchi et al. "Effect of Electron Irradiation on the Ferroelectric Transition of P(VDF–TrFE) Copolymers".
Macromolecules 1985, vol. 18, pp. 910–918, Andrew J. Lovinger, "Polymorphic Transformations in Ferroelectric Copolymers of Vinylidene Fluoride Induced by Electron Irradiation".
Nuclear Instruments and Methods in Physics Research, B46 (1990), pp. 334–337, F. Macchi et al., "Micromechanical Properties of Electron Irradiated PVDF–TrFE Copolymers".
International Search Report for PCT Patent Application No. PCT/US02/09181, Oct. 10, 2002.

* cited by examiner

Primary Examiner—Ramsey Zacharia
(74) Attorney, Agent, or Firm—Ohlandt, Greeley, Ruggiero & Perle, L.L.P.

(57) ABSTRACT

There are disclosed new polymer materials having improved electric field induced strain levels, dielectric constants, and elastic energy densities for use in electromechanical and dielectric applications. Methods of manufacture of new polymer materials are also disclosed.

5 Claims, 5 Drawing Sheets

TERPOLYMER SYSTEMS FOR ELECTROMECHANICAL AND DIELECTRIC APPLICATIONS

This application claims priority from U.S. Provisional Application No. 60/280,303, filed Mar. 30, 2001, and is a continuation-in-part application of U.S. Ser. No. 09/195,061, filed Nov. 18, 1998, now U.S. Pat. No. 6,423,412.

BACKGROUND OF THE INVENTION

1. Field of the Invention

The present invention relates to polymeric materials with elevated electric field induced strain levels, elevated elastic energy densities, and having elevated dielectric constants at room temperature. The material can be used in electromechanical devices which convert electric energy into mechanical energy or convert mechanical energy into electric energy. Material of the invention can also be used as a capacitor which stores electric energy and regulates electric voltage in a circuit.

2. Description of the Prior Art

Both polymers and inorganic materials (such as ceramics) have been used widely in electromechanical devices such as actuators, transducers, artificial muscles and robots. However, in the currently available commercial materials, the strain level and elastic energy density both are quite low (strain ~0.1% and elastic density ~0.1 J/cm$^3$), which causes many problems for device performance. For example, in order to generate large actuation, in many current devices, an amplification scheme has to be used. In addition, the low elastic energy density also reduces the force and power output of the electromechanical devices. In order to improve the performance of a wide variety of electromechanical devices, it is required that the electric field induced strain level and elastic energy density be improved.

Polymers are also used widely in capacitors for high voltage operation and charge storage. However, the dielectric constant of the current commercial polymers is quite low (below 10). A high dielectric constant polymer can reduce the capacity volume and charge storage capability of the capacity.

In spite of their advantages over the ceramics, current polymers suffer low field sensitivities, such as dielectric constant, piezoelectric coefficient, electromechanical coupling factor and field induced strain. These constraints severely limit the application of ferroelectric polymers as transducers, sensors and actuators.

There is a demand for improved materials for use in actuators and transducers due to the limitations of currently available materials. For example, current actuator materials, such as electrostatic, electromagnetic and piezoelectric materials, exhibit limitations in one or more of the following performance parameters: strain, elastic energy density, speed of response and efficiency. For instance, piezoceramic and magnetostrictive materials, while possessing low hysteresis and high response speeds, suffer from low strain levels (~0.1%). Shape memory alloys generate high strain and high force but are often associated with large hysteresis and very slow response speeds. On the other hand, there are several polymers such as polyurethane, polybutadine etc. which can generate high electric field induced strain i.e. up to 6–11%. But, due to their low elastic modulus, their elastic energy density is very low. Further, the strain generated in these materials is mainly due to the electrostatic effect, which is a low frequency process. Use of these materials at high frequencies reduces their response drastically. In addition, due to their low dielectric constant, the electric energy density of these polymers is very low which is an undesirable characteristic for many transducer and actuator applications.

Substantial efforts have been devoted to improvement of phase switching materials where an antiferroelectric and ferroelectric phase change can be field induced to cause a high strain in the material. While strains higher than 0.7% have been achieved in such materials, due to the brittleness of ceramics, severe fatigue has been found to occur at high strain levels. Recently, in a single crystal ferroelectric relaxor, i.e., PZN-PT, an electric field strain of about 1.7%, with very little hysteresis, has been reported, which is exceptionally high for an inorganic materials (see: Park and Shrout, J Appl. Phys., 82, 1804 (1997)). In such ceramic materials, mechanical fatigue occurs at high strain levels, a major obstacle limiting their use for many applications.

For many applications, such as microrobots, artificial muscles, vibration controllers, etc., higher strain levels and higher energy densities are required. Thus, there is a need for a general purpose electroactive material with improved performance for use with transducer and actuators.

There is a further requirement for improved ultrasonic transducers and sensors for use in medical imaging applications and low frequency acoustic transducers. Current piezoceramic transducer materials, such as PZTs, have a large acoustic impedance (Z>35 Mrayls) mismatch with the air and human tissue (Z<2 Mrayls). On the other hand, piezoelectric polymers such as P(VDF-TrFE), PVDF not only have an acoustic impedance well matched (Z<4 Mrayls) to human tissue but also offer a broad nonresonant frequency bandwidth. But, because of their low piezoelectric activity and low coupling coefficient, the sensitivity of such ultrasonic polymer transducers is very low.

The capacitor industry also requires a capacitor which has a much higher electric energy density than is currently available. Current dielectric materials, such as polymers, have a low dielectric constant (~2–10) and limited energy density. In addition, with current ceramics, the maximum field which can be applied is limited.

Accordingly, it is an object of the invention to provide a polymeric material which can generate a high electric field-induced strain with little hysteresis.

It is another object of the invention to provide a polymeric material which exhibits a high elastic energy density.

It is yet another object of the invention to provide a polymeric material that exhibits a room temperature dielectric constant that is higher than other currently available polymers.

These and other objects and advantages of the present invention and equivalents thereof, are achieved by compositions for electrical or electomechanical devices.

SUMMARY OF THE INVENTION

The present invention provides polymers prepared by a polymerizing a mixture of three monomers comprising: at least one monomer of vinylidene-fluoride; at least one monomer selected from the group consisting of trifluoroethylene and tetrafluoroethylene; and at least one monomer selected from the group consisting of tetrafluoroethylene, vinyl fluoride, perfluoro (methyl vinyl ether); bromotrifluoroethylene, chlorofluoroethylene, chlorotrifluoroethylene, and hexafluoropropylene. Polymers of the invention exhibit an electrostrictive strain, at room temperature, of 3% or more when an electric field gradient of 100 megavolts per meter or greater is applied thereacross, exhibit a dielectric constant, at room temperature, of 40 or higher at 1 kHz, and exhibit an elastic energy density, at room temperature, of 0.3 joules/cm$^3$ or higher, or any combinations thereof.

The present invention also provides a process for the preparation of polymers comprising: polymerizing a mixture of three monomers comprising at least one monomer of vinylidene-fluoride; at least one monomer selected from the group consisting of trifluoroethylene and tetrafluoroethylene; and at least one monomer selected from the group consisting of tetrafluoroethylene, vinyl fluoride, perfluoro-(methyl vinyl ether), bromotrifluoroethylene, chlorofluoroethylene, chlorotrifluoroethylene, and hexafluoropropylene; stretching said polymer greater than its original length; and thereafter annealing said polymer at a temperature below its melting point, wherein said polymer exhibits an electrostrictive strain, at room temperature, of 3% or more when an electric field gradient of 100 megavolts per meter or greater is applied thereacross, exhibits a dielectric constant, at room temperature, of 40 or higher at 1 kHz, and exhibits an elastic energy density, at room temperature, of 0.3 joules/cm$^3$ or higher, or any combinations thereof.

Also provided are electrical or electromechanical devices comprising at least one layer of a polymer of the invention. Polymers include, but are not necessarily limited to, polyvinylidene fluoride-trifluoroethylene-chlorofluoroethylene P(VDF-TrFE-CFE), polyvinylidene fluoride-trifluoroethylene-chlorotrifluoroethylene P(VDF-TrFE-CTFE), polyvinylidene fluoride-tetrafluoroethylene-chlorotrifluoroethylene, polyvinylidene fluoride-trifluoroethylene-hexafluoropropylene, polyvinylidene fluoride-tetrafluoroethylene-hexafluoropropylene, polyvinylidene fluoride-trifluoroethylene-tetrafluoroethylene, polyvinylidene fluoride-tetrafluoroethylene-tetrafluoroethylene, polyvinylidene fluoride-trifluoroethylene-vinyl fluoride, polyvinylidene fluoride-tetrafluoroethylene-vinyl fluoride, polyvinylidene fluoride-trifluoroethylene-perfluoro(methyl vinyl ether), polyvinylidene fluoride-tetrafluoroethylene-perfluoro(methyl vinyl ether), polyvinylidene fluoride-trifluoroethylene-bromotrifluoroethylene, polyvinylidene fluoride-tetrafluoroethylene-bromotrifluoroethylene, polyvinylidene fluoride-tetrafluoroethylene-chlorofluoroethylene, polyvinylidene fluoride-trifluoroethylene-vinylidene chloride, and polyvinylidene fluoride-tetrafluoroethylene-vinylidene chloride

DETAILED DESCRIPTION OF THE INVENTION

Figure 1:
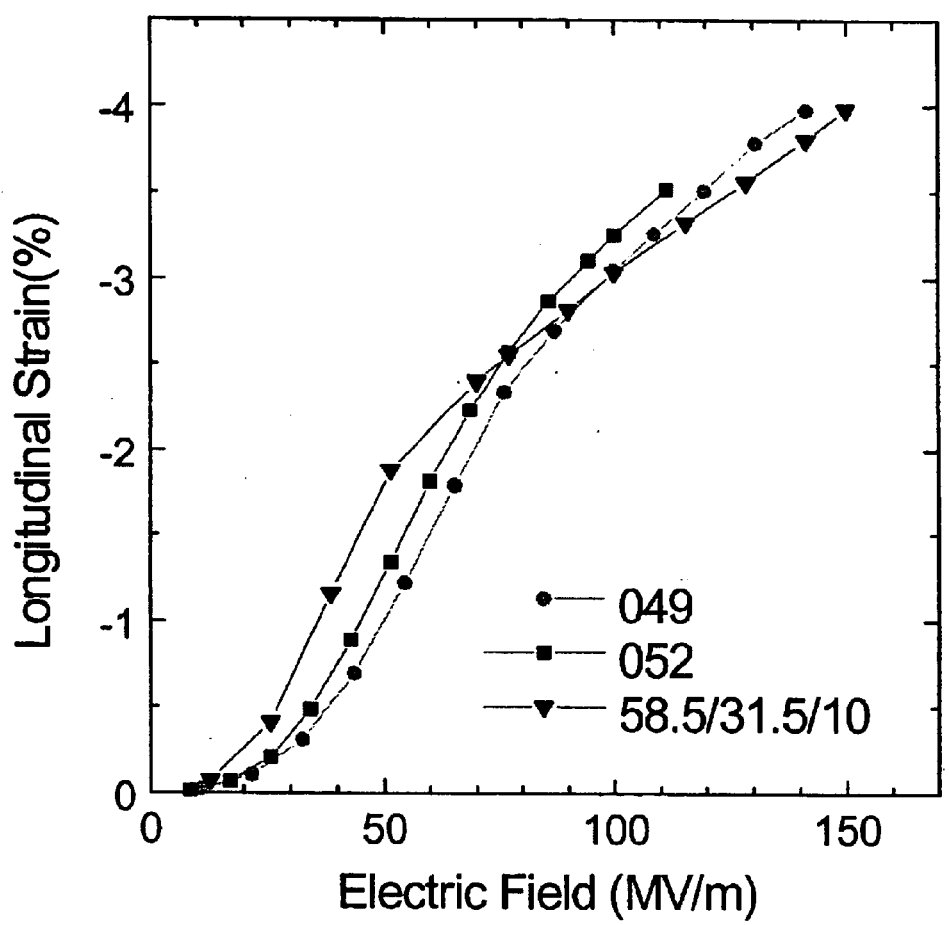
FIG. 1 is a graph of electric field induced logitudinal strain as a function of the applied field amplitude for the terpolymer P(VDF-TrFE-CTFE). The terpolymer No. 49 is 72.2/17.8/10 mol %; the terpolymer No. 52 is 66/22.5/11.5 mol %; and the third embodiment of the graph is the terpolymer 58.5/31.5/10 mol %. All measurements were made at room temperature.
Figure 2:
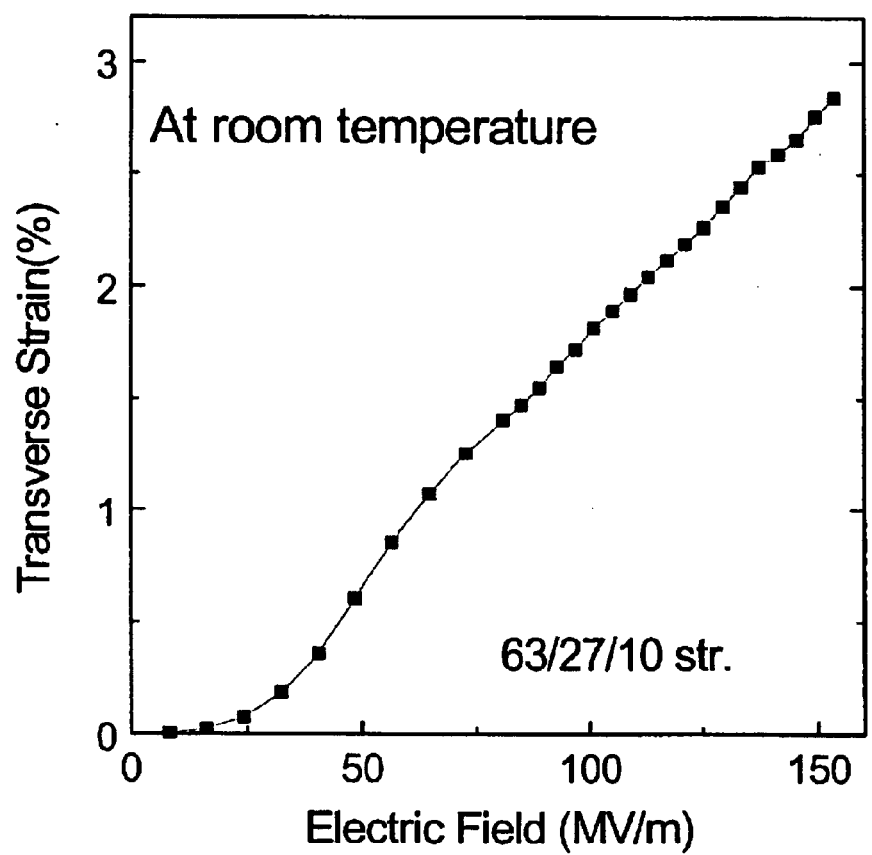
FIG. 2 is a graph of the field induced transverse strain as a function of the applied field amplitude for the uniaxially stretched terpolymer P(VDF-TrFE-CTFE), 63.1/25.4/11.5 mol % measured at room temperature.
Figure 3:
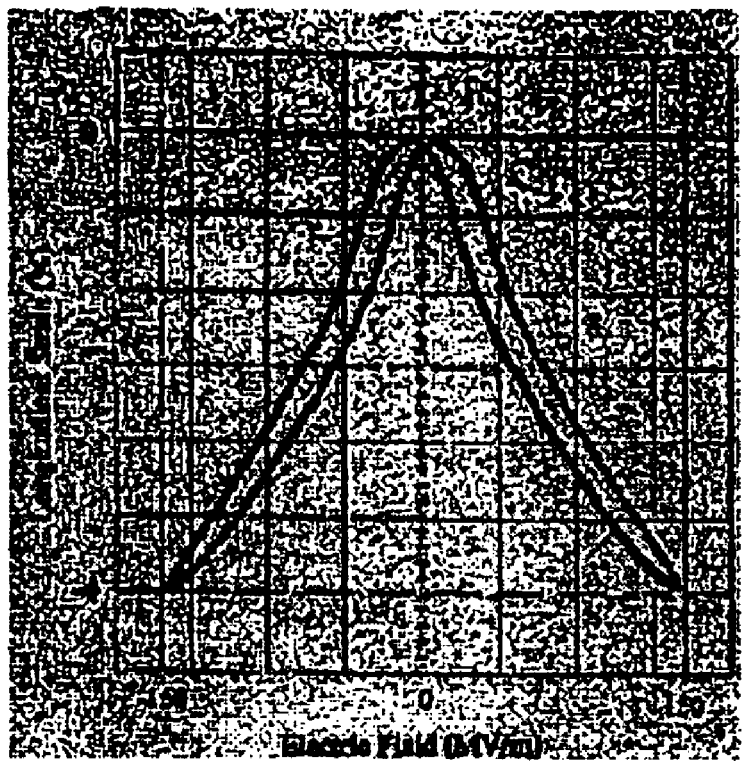
FIG. 3 is a graph of the strain hysteresis loop for the terpolymer P(VDF-TrFE-CTFE), 58.5/31.5/10 mol %.

It was found that in certain classes of terpolymer systems such as P(VDF-TrFE-CTFE) (poly(vinylidene fluoride-trifluoroethylene-chlorotrifluoroethylene)) and P(VDF-TrFE-CFE) (poly(vinylidene fluoride-trifluoroethylene-chlorofluoroethylene)), an ultrahigh electric field induced strain can be achieved. In P(VDF-TrFE-CTFE), as shown in FIG. 1, a thickness strain of −4% can be induced. If the terpolymer is mechanically stretched (4 to 5 times of the original length) and annealed afterwards at a temperature 5 to 15 degrees below the melting temperature of the polymer, a large field induced transverse strain (~3%), see FIG. 2, can be obtained. Electrostrictive strains of about 3% or above are preferred. In addition, the terpolymer has an elastic modulus at room temperature of 0.5 GPa, which results in an elastic energy density (per unit volume) ~0.4 J/cm$^3$. Preferred elastic energy densities of terpolymers of the invention are ~0.3 J/cm$^3$ or above. Such a large strain with a very low hysteresis (see FIG. 3) is very useful for electromechanical devices.

Figure 4A:
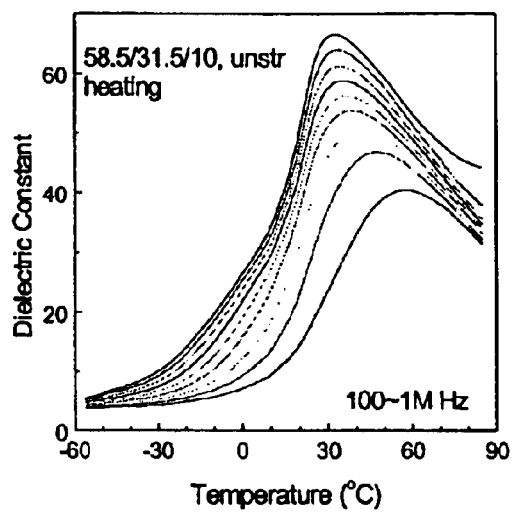
FIG. 4a and FIG. 4b are graphs of the dialectric constant and loss, respectively, as a function of temperature of the terpolymer P(VDF-TrFE-CTFE) in the frequency range from 100 Hz to 1 MHz (dielectric constant: from the top to bottom: 100, 300, 1 k, 3 k, 10 k, 30 k, 100 k, 300 k, and 1 MHz) (dielectric loss: from the bottom to top: 100, 300, 1 k, 3 k, 10 k, 30 k, 100 k, 300 k, and 1 MHz).
Figure 4B:
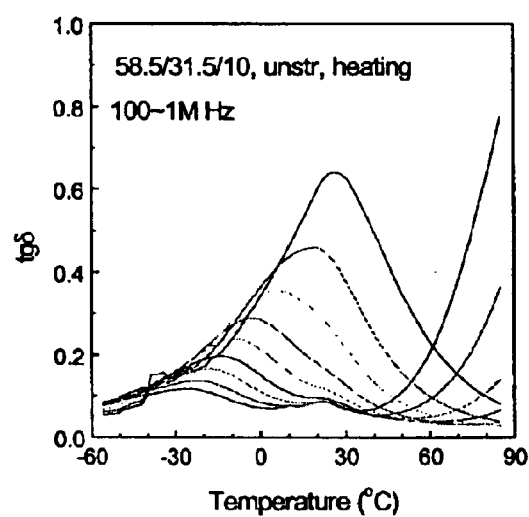

It was also found that the P(VDF-TrFE-CTFE) terpolymer has a very high room temperature dielectric constant (c.f., FIG. 4), at 100 Hz, the room temperature dielectric constant can be more that 65, which is significantly higher than any commercial polymers. Dielectric constants of the terpolymers of the invention are preferably 40 or above.

For those applications, the composition of the terpolymer P(VDF$_x$-TrFE$_y$-CTFE$_{1-x-y}$) should be: x is in the range of 0.55–0.75 and y in the range of 0.15–0.35.

Figure 5:
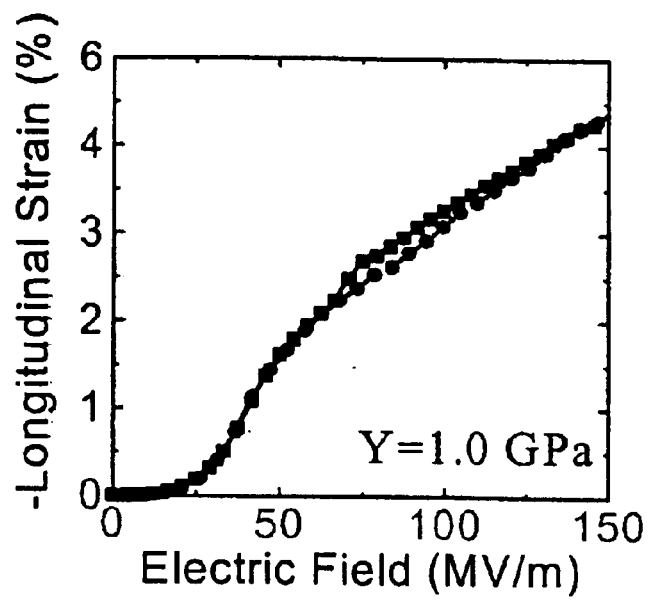
FIG. 5. is a graph of the field induced longitudinal strain as a function of the applied field amplitude for the terpolymer P(VDF-TrFE-CFE), 60/36/4 mol % measured at room temperature.

In P(VDF-TrFE-CFE) terpolymer system, as shown in FIG. 5, there is also a large thickness strain induced electrically. In this terpolymer (60/36/4 mol %, P(VDF$_x$-TrFE$_y$-CFE$_{1-x-y}$)), a relatively high thickness strain (−4.5%) can be induced under a field ~150 MV/m The terpolymer also exhibits a high elastic modulus ~1 GPa which results in an elastic energy density ~1 J/cm$^3$, much higher than those in the piezoelectric materials. For this terpolymer system, the composition range of P(VDF$_x$-TrFE$_y$-CFE$_{1-x-y}$), x should be in the range of 0.55–0.8 and y in the range of 0.15–0.4.

The high strain and high elastic energy density discovered in the terpolymer systems here are very attractive because it is well known that polymers can withstand high elastic strains without fatigue. This is a clear advantage over any inorganic material where the fatigue at high mechanical strain is a serious problem for the electromechanical device applications.

The present invention discloses a series of terpolymer systems which preferably exhibit high electric field induced strain with high elastic energy density and also high room temperature dielectric constant. The terpolymer systems include poly(vinylidene fluoride-trifluoroethylene-chlorofluoroethylene), poly(vinylidene fluoride-trifluoroethylene-vinylidene chloride), poly(vinylidene fluoride-trifluoroethylene-tetrafluoroethylene), poly(vinylidene fluoride-trifluoroethylene-vinyl fluoride), poly(vinylidene fluoride-trifluoroethylene-perfluoro(Methyl vinyl ether)), poly(vinylidene fluoride-trifluoroethylenebromotrifluoroethylene), poly(vinylidene fluoride-trifluoroethylene-chlorofluoroethylene), and poly(vinylidene fluoride-trifluoroethylene-vinylidene chloride).

High strain and high dielectric constant polymer systems, high energy irradiated P(VDF-TrFE) copolymers, have been earlier disclosed. An advantage of the current terpolymer systems is that the irradiation step used with the copolymer systems is eliminated. This saves manufacture cost and improves the reliability and reproducibility of the electroactive polymer systems.

Polymers of the present invention are conveniently prepared or synthesized by polymerizing processing known in the art, such as suspension, emulsion, or solutions methods. Three monomers (i.e., VDF. TrFE, CFE) are selected and contacted or mixed in proportion in the presence of a suitable catalyst or initiator. The resultant terpolymer systems should have a convenient molecular weight suitable for use in electrical or electromechanical devices. The molecular weight of the polymer systems of the present invention is not limited. The molecular weight of terpolymers is preferably, but not limited to, higher than about 50,000, more preferably higher than 100,000, and yet more preferably from about 100,000 to about 300,000.

Although the present invention describes in detail certain embodiments, it is understood that variations and modifications exist known to those skilled in the art that are within the invention. Accordingly, the present invention is intended to encompass all such alternatives, modifications and variations that are within the scope of the invention as set forth in the following claims.

What is claimed is:

1. A polymer prepared by a polymerizing a mixture of three different monomers comprising:
   (a) at least one monomer of vinylidene-fluoride;
   (b) at least one monomer selected from the group consisting of trifluoroethylene and tetrafluoroethylene; and
   (c) at least one monomer selected from the group consisting of tetrafluoroethylene; vinyl fluoride; perfluoro (methyl vinyl ether); bromotrifluoroethylene; chlorofluoroethylene; chlorotrifluoroethylene; and hexafluoropropylene;
   wherein when said polymer is stretched to greater than its original length and thereafter annealed at a temperature below its melting point, it exhibits (1) an electrostrictive strain, at room temperature, of 3% or more when an electric field gradient of 100 megavolts per meter or greater is applied thereacross optionally; (2) a dielectric constant, at room temperature, of 40 or higher at 1 kHz; and (3) an elastic energy density, at room temperature, of 0.3 joules/cm$^3$ or higher.

2. The polymer of claim 1, wherein said polymer is selected from the group consisting of polyvinylidene fluoride-trifluoroethylene-chlorofluoroethylene polyvinylidene fluoride-trifluoroethylene-chlorotrifluoroethylene, polyvinylidene fluoride-tetrafluoroethylene-chlorotrifluoroethylene, polyvinylidene fluoride-trifluoroethylene-hexafluoropropylene, polyvinylidene fluoride-tetrafluoroethylene-hexafluoropropylene, polyvinylidene fluoride-trifluoroethylene-tetrafluoroethylene, polyvinylidene fluoride-tetrafluoroethylene-tetrafluoroethylene, polyvinylidene fluoride-trifluoroethylene-vinyl fluoride, polyvinylidene fluoride-tetrafluoroethylene-vinyl fluoride, polyvinylidene fluoride-trifluoroethylene-perfluoro(methyl vinyl ether), polyvinylidene fluoride-tetrafluoroethylene-perfluoro(methyl vinyl ether), polyvinylidene fluoride-trifluoroethylene-bromotrifluoroethylene, polyvinylidene fluoride-tetrafluoroethylene-bromotrifluoroethylene, polyvinylidene fluoride-tetrafluoroethylene-chlorofluoroethylene, polyvinylidene fluoride-trifluoroethylene-vinylidene chloride, and polyvinylidene fluoride-tetrafluoroethylene-vinylidene chloride.

3. An electrical or electromechanical device comprising at least one layer of a polymer of claim 1.

4. The electrical or electromechanical device of claim 3, wherein said polymer is selected from the group consisting of polyvinylidene fluoride-trifluoroethylene-chlorofluoroethylene, polyvinylidene fluoride-trifluoroethylene-chlorotrifluoroethylene, polyvinylidene fluoride-tetrafluoroethylene-chlorotrifluoroethylene, polyvinylidene fluoride-trifluoroethylene-hexafluoropropylene, polyvinylidene fluoride-tetrafluoroethylene-hexafluoropropylene, polyvinylidene fluoride-trifluoroethylene-tetrafluoroethylene, polyvinylidene fluoride-tetrafluoroethylene-tetrafluoroethylene, polyvinylidene fluoride-trifluoroethylene-vinyl fluoride, polyvinylidene fluoride-tetrafluoroethylene-vinyl fluoride, polyvinylidene fluoride-trifluoroethylene-perfluoro(methyl vinyl ether), polyvinylidene fluoride-tetrafluoroethylene-perfluoro(methyl vinyl ether), polyvinylidene fluoride-trifluoroethylene-bromotrifluoroethylene, polyvinylidene fluoride-tetrafluoroethylene-bromotrifluoroethylene, polyvinylidene fluoride-tetrafluoroethylene-chlorofluoroethylene polyvinylidene fluoride-trifluoroethylene-vinylidene chloride, and polyvinylidene fluoride-tetrafluoroethylene-vinylidene chloride.

5. A polymer prepared by a polymerizing a mixture of three different monomers comprising:
   (a) at least one monomer of vinylidene-fluoride;
   (b) at least one monomer selected from the group consisting of trifluoroethylene and tetrafluoroethylene; and
   (c) at least one monomer selected from the group consisting of tetrafluoroethylene; vinyl fluoride; perfluoro (methyl vinyl ether); bromotrifluoroethylene; chlorofluoroethylene; chlorotrifluoroethylene; and hexafluoropropylene;
   wherein said polymer is stretched to greater than its original length and thereafter annealed at a temperature below its melting point such that it exhibits (1) an electrostrictive strain, at room temperature, of 3% or more when an electric field gradient of 100 megavolts per meter or greater is applied thereacross; (2) a dielectric constant, at room temperature, of 40 or higher at 1 kHz; (3) an elastic energy density, at room temperature, of 3 joules/cm$^3$ or higher; or (4) any combinations thereof.

* * * * *

UNITED STATES PATENT AND TRADEMARK OFFICE
CERTIFICATE OF CORRECTION

PATENT NO. : 6,787,238 B2
DATED : September 7, 2004
INVENTOR(S) : Zhang et al.

It is certified that error appears in the above-identified patent and that said Letters Patent is hereby corrected as shown below:

<u>Title page,</u>
Item [56], References Cited, U.S. PATENT DOCUMENTS, after the phrase "now U.S. Pat No. 6,423,412." to read as follows;
-- This invention was made with support from the Government under DARPA/ONR Contract No. NO0173-99-C-2003 and ONR Contract No. NO0014-97-1-0900. The Government has certain rights in the invention. --

Signed and Sealed this

Twelfth Day of April, 2005

JON W. DUDAS
*Director of the United States Patent and Trademark Office*